United States Patent [19]

Denes et al.

[11] 4,415,607

[45] Nov. 15, 1983

[54] METHOD OF MANUFACTURING PRINTED CIRCUIT NETWORK DEVICES

[75] Inventors: Oscar L. Denes, Greendale; Lynn R. Kiphart, Milwaukee; Paul P. Szalewski, Grafton, all of Wis.

[73] Assignee: Allen-Bradley Company, Milwaukee, Wis.

[21] Appl. No.: 417,001

[22] Filed: Sep. 13, 1982

[51] Int. Cl.³ .............................................. H05K 3/20
[52] U.S. Cl. ...................................... 427/96; 156/230; 29/832; 29/620; 29/840; 428/901
[58] Field of Search .................. 156/230; 29/832, 840, 29/620; 427/96; 428/901

[56] References Cited

U.S. PATENT DOCUMENTS

| | | | |
|---|---|---|---|
| 634,523 | 10/1899 | Epp . | |
| 2,447,541 | 8/1948 | Sabee et al. | 154/94 |
| 2,692,190 | 10/1954 | Pritikin | 41/42 |
| 2,724,674 | 11/1955 | Pritikin | 154/95 |
| 2,874,085 | 2/1959 | Brietzke | 154/94 |
| 3,181,986 | 5/1965 | Pritikin | 156/233 |
| 3,282,755 | 11/1966 | Tischler | 156/3 |
| 3,956,041 | 5/1976 | Polichette et al. | 428/901 |
| 4,329,779 | 5/1982 | England | 29/840 |

Primary Examiner—Norman Morgenstern
Assistant Examiner—James Seidleck
Attorney, Agent, or Firm—Arnold J. Ericsen

[57] ABSTRACT

A method of making a printed circuit network device including steps of depositing an insulating primary substrate layer on a temporary support member having a release surface, applying to the exposed surface of the primary substrate layer certain defined conductor areas, applying defined resistor areas on the exposed surface of the primary substrate layer and in electrical connection with the conductor areas, trimming the respective resistor areas to a predetermined resistive value, mounting the temporary support member with its several layers in facing relationship with a permanent support member, and thereafter releasing and removing the temporary support member from the mounted primary support layer.

8 Claims, 8 Drawing Figures

METHOD OF MANUFACTURING PRINTED CIRCUIT NETWORK DEVICES

FIELD OF THE INVENTION

This invention relates to a printed circuit network device and the method of producing the same.

BACKGROUND OF THE INVENTION

There have been several investigative efforts to commercially supply printed circuit devices employing plastic conducting materials by means of first preparing a decalcomania or some other temporary support means and later depositing conductors and/or resistors on the temporary support for transfer to a permanent support. Examples of prior publications may be found in the Pritikin U.S. Pat. Nos. 2,692,190, which issued Oct. 19, 1954, 2,724,674, which issued Nov. 22, 1955, and U.S. Pat. No. 3,181,986 issuing on May 4, 1965. Other examples of prior art circuits utilizing temporary installation means may be found in the Sabee et al. U.S. Pat. No. 2,447,541, which issued Aug. 24, 1948, and the Brietzke U.S. Pat. No. 2,874,085 issuing on Feb. 17, 1959.

It will be apparent that the above-referred to patents each disclose various means of making printed circuits and are, in particular, directed to the conductive paths for said circuits.

SUMMARY OF THE INVENTION

The present invention provides a printed circuit network device, which may be packaged, if desired, in conventional "DIP" (dual in-line package) and "SIP" (single in-line package) configurations. The circuits usually include integrally formed resistive paths or resistor areas connected to conductive paths, or conductors. It will be apparent that, for facile and expeditious manufacture, it is preferred to lay down the resistive layer or layers by means of a "bulk" manufacturing process step, and to thereafter "trim" the respective resistive layers to a predetermined value. In conventional processes, nearly all of the manufacturing steps are completed prior to the introduction of the trimming procedure. Thus, should it be necessary to scrap particular resistive devices for various reasons, the decision to do so in the past has generally been made after manufacture has been completed which adds materially to the cost. Obviously, it is preferred to eliminate commercially unacceptable devices at the earliest possible stage and, particularly, before the attachment of the circuit components to a permanent support member. It is usual to mold such permanent support by means of relatively expensive molding techniques along with the introduction of relatively expensive terminal leads, which would also necessarily be added to the nonrecoverable scrap costs.

Accordingly, it is the principal object of the present invention to provide an economical method of manufacturing a printed circuit network device or package which will permit usage of relatively low cost conductive materials and to eliminate expensive processing steps; especially unnecessary steps taking place after rejection of such devices because of not meeting predetermined manufacturing standards.

It is a specific object of the present invention to provide a method of manufacturing an electrical network package which includes the steps of depositing an insulating primary substrate layer on a temporary support member which has a release surface, applying to the primary substrate layer certain defined conductor areas of conductive material on the exposed surface of the substrate layer, applying defined resistor areas on the exposed surface of the primary substrate area and in electrical connection with the conductor areas, trimming the resistor areas to a predetermined resistive value and mounting the temporary support member with its several layers in facing relationship with a permanent support member, and thereafter releasing and removing the temporary support member from the mounted primary substrate layer.

It is a further specific object of the present invention to provide an electrical network package which includes as an interim stage in its manufacture the deposition of conductor areas and resistor areas on an exposed surface of a primary substrate layer which has been previously deposited on a release surface of a temporary support member, and finalizing the trimming function on the resistor areas prior to mounting the device to a permanent support member.

DESCRIPTION OF THE PREFERRED EMBODIMENT

Referring first to the views of FIGS. 1-5, inclusive, it will be apparent from the following description that certain interim measures may be taken during the course of manufacturing a network package prior to fabricating a permanent commercially acceptable device. That is, various steps in the manufacture may be provided utilizing a temporary support member, and should there be any manufacturing problems or variances from acceptable tolerances or other deficiencies, a particular preassembly may be discarded at an early process stage prior to permanent assembly. Considerable manufacturing cost savings may thus be realized in the case of discarded devices.

Figure 1:
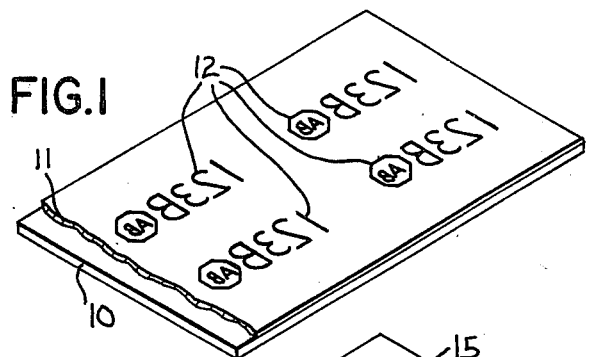
FIG. 1 is a perspective view, with portions broken away, of a temporary support member with a release surface and having certain identifying indicia printed thereon in reverse format.
Figure 2:
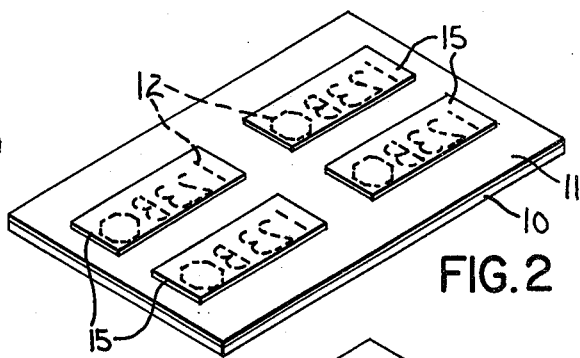
FIG. 2 illustrates the temporary support member of FIG. 1 with an insulating primary substrate layer deposited on certain areas of the temporary support member and overlying the aforementioned indicia.

It will be observed from FIG. 1 that a suitable temporary support member 10 may be provided in the form of a supercalendared, clay-coated one side natural kraft paper, coated on the clay side with a silicone release coating 11. This paper is readily available as "Release Paper #8503" from H. P. Smith, a subsidiary of Phillips Petroleum Company, Chicago, Ill. The release coated paper base 10 will provide a temporary support for most of the manufacturing functions or steps, and may be readily removed upon completion of the finished device.

If it is desired to print indicia, such as a logo and/or identification number, this indicia 12 may be printed directly on the release coated surface 11 in reverse format as shown in FIG. 1. Obviously, considerable savings in manufacturing costs will be achieved by fabricating a plurality of devices simultaneously on a single temporary support member 10, four of which are shown in the views of FIGS. 1-5, inclusive. The indicia 12 may be printed by any of several conventional procedures, but it has been found to be suitable to utilize a screen printing technique with a 230 mesh screen with an "ink" formulated from a ferric oxide loaded epoxy resin vehicle dissolved in a combined butyl Cellosolve acetate and n-butanol solvent. The epoxy resin can be obtained from the Shell Oil Company as Epon Resin #1009, and the usual curing agent may be Cymel 301 obtained from American Cyanamid with a hexamethoxymethylmelamine base.

An essential stage in the procedure of this invention is the application of a deposited primary substrate layer 15, which may be screen printed or otherwise deposited on the release surface 11 of the temporary support member 10. As shown, when indicia 12 are desired, the primary support layers 15 are disposed to overlie the indicia 12. The layer 15 is of insulating material, and may be screen printed with a 165 mesh screen, utilizing a coating material having an epoxy resin base substantially the same as that utilized in the indicia material, but with a titanium dioxide filler substituted for the ferric oxide material in the indicia. Obviously, in the case of both the indicia coating and the primary substrate coating, the materials are permitted to cure in the usual manner prior to application of subsequent layers.

Figure 3:
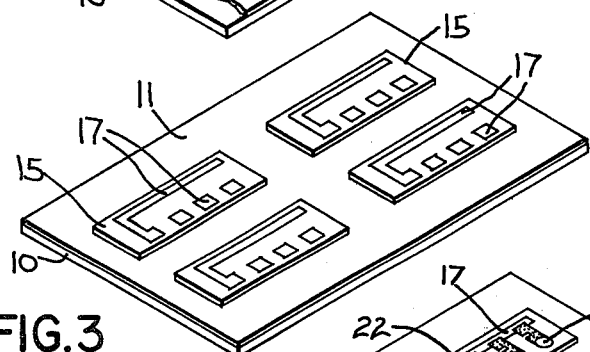
FIG. 3 is a view similar to FIG. 2, wherein certain conductor areas are printed on the exposed surface of the primary substrate layer.

Although it is within the province of the present invention to deposit conductor areas and resistor areas in a choice of sequential steps, it has been found to be preferred to initially deposit conductor areas 17 as the next procedural step indicated at FIG. 3. These conductor areas 17 permit a later deposition of resistor areas 19 (see FIG. 4) in contact therewith. As shown (although greatly enlarged), the conductor areas 17 are preferably screen printed using a 200 mesh screen with a conductive plastic termination ink made essentially from the same epoxy resin based vehicle used previously and loaded with a conductive material such as Vulcan Carbon XC-72R available from Cabot Corporation, in addition to a "P" type silver powder available from Engelhard Industries mixed with Silflake 135 from Handy & Harmon.

Figure 4:
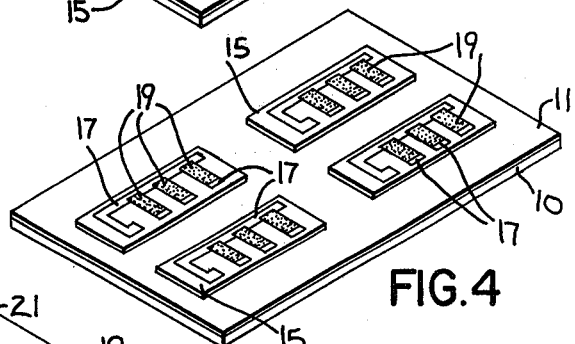
FIG. 4 illustrates the deposition of resistor areas printed to overlie the conductor areas of FIG. 3.

As stated previously, the preferred embodiment next includes the step of depositing a layer of resistive material to defined resistor areas 19 as illustrated in FIG. 4. These areas are deposited to preferably overlie the conductor areas 17. This resistor area 19 is also preferably screen printed with a 200 mesh screen and utilizing a resistance ink using a substantially identical epoxy resin vehicle previously described and loaded with the desired amount of Vulcan Carbon XC-72R from Cabot Corporation combined with channel black carbon particles.

Figure 5:
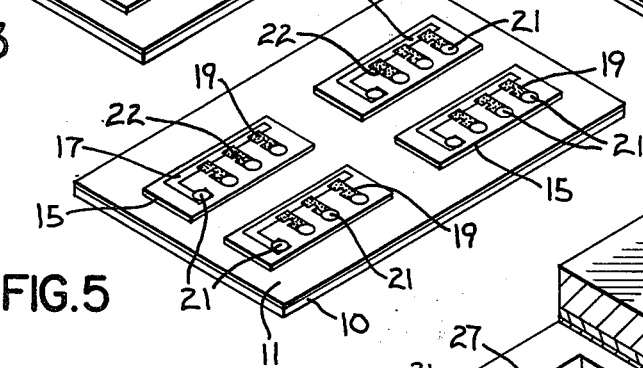
FIG. 5 illustrates two additional stages in the manufacture of the network package, wherein conducting contactor areas are printed or deposited over a portion of the resistor areas to provide termination pads, and also to illustrate the trimming operation performed on the resistor areas.

With reference to FIG. 5, it is also preferable to provide conductive termination contactor areas 21 utilizing an epoxy resin vehicle and loaded with "P" type silver and Silflake 135, as in the case of the conductor areas 17. FIG. 5 also illustrates a means of trimming the resistor areas 19 by removing a notched portion 22 by conventional trimming means, and in this case, preferably with the use of a laser type trimming apparatus.

It will now be apparent that all of the essential steps for manufacturing a trimmed resistive network have been completed by performing intermediate process stages of manufacture utilizing a temporary carrier or support member 10. In this case, the support member is in the form of a release coated kraft paper. Obviously, other temporary support means (not shown) could be used, so long as they permit removal after application of a permanent support member, such as will next be described. Accordingly, should inspection at each stage, or even after the trimming step of FIG. 5 has been completed, indicate an unacceptable resistor network, this may be removed from the temporary support 10, in order that the manufacture may be interrupted at an early stage before the device has been made permanent and rejected or scrapped after the necessary labor, materials and time have been expended.

Figure 6:
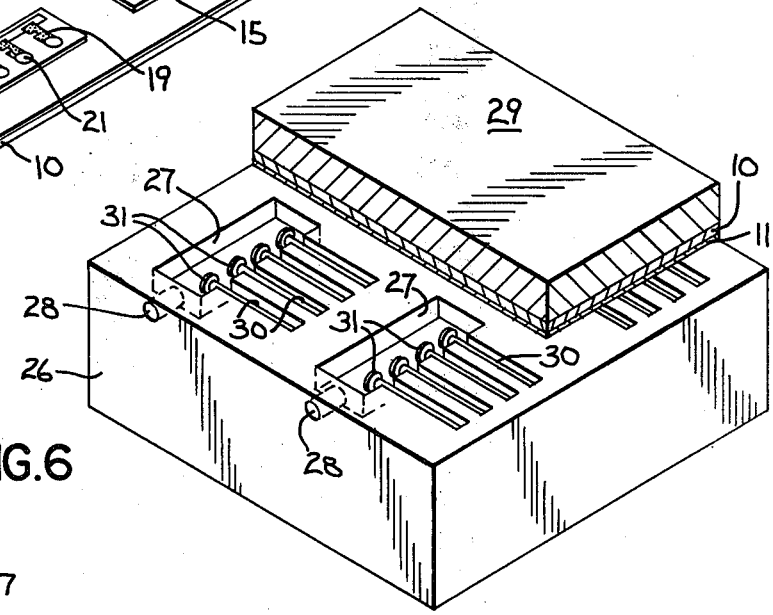
FIG. 6 is a diagrammatic illustration in perspective of mating die members in position preparatory to molding of a permanent base or support member, and with terminating lead members disposed in the die cavities.

The permanent base or support 25 may next be applied, either by coating an adhesive (not shown) on a relatively stiff member and "gluing" the finished network to the base. Preferably, however, as shown in FIG. 6, an insulating permanent support member or base 25 is injection molded directly to the preformed assembly of FIG. 5. With reference to FIG. 6, a die member 26, including molding cavities 27 communicating with ports 28, is provided with a mating die member 29 having a flat undersurface facing the cavities 27. Each cavity 27 is preloaded with a terminal lead 30. The leads 30 are shown here and in FIG. 5 with a contact head 31 engaging contactor area 21, although in some cases the terminal leads 30 may be a pin-type lead, with or without a head (not shown), and extending from the lower surface of the base 25 with respect to FIG. 7. This is a matter of customer preference.

Figure 7:
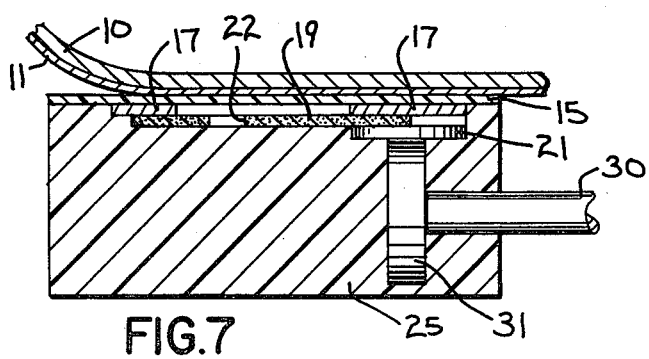
FIG. 7 is a cross sectional view, taken along lines 7—7 of FIG. 8, of a finished SIP network package made in accordance with the present invention and preparatory to removal of the temporary support member.
Figure 8:
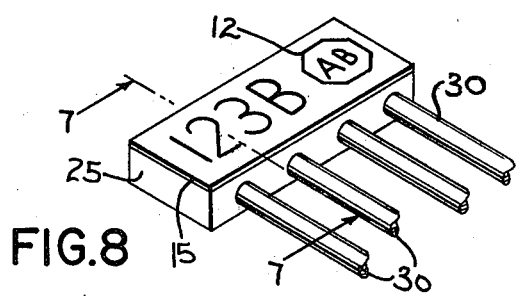
FIG. 8 is a perspective view illustrating a finished SIP network package made in accordance with the present invention.

As shown in FIG. 7, the last manufacturing stage involves the removal of the temporary support member 10 from the various molded network assemblies.

It will be apparent from the foregoing description that there has been provided a novel method of manufacturing an electrical network package, wherein interim manufacturing steps or stages may take place in the facile and economical manner prior to permanent assembly, and by means of accomplishing each of the various steps on a temporary, releasable support member which is later removed after final fabrication.

The embodiments of the invention of which an exclusive property or privilege is claimed are defined as follows:

1. A method of manufacturing an electrical network package comprising the steps of:
   providing a temporary support member having a release surface;
   depositing an insulating primary substrate layer on said release surface;

depositing defined conductor areas of conductive material to the exposed surface of said primary substrate layer;

joining said temporary support member to a permanent insulating support member with the said substrate layer and its aforestated pre-applied conductor areas in facing relationship with a supporting surface of said permanent support member; and releasing and removing said temporary support member from said primary substrate layer.

2. The method of claim 1, wherein the permanent insulating support member is formed of a molded plastic material.

3. The method of claim 1, wherein the temporary support member is a release coated paper material.

4. The method of claim 1, and further comprising the steps of:

depositing defined resistor areas of resistive material to the exposed surface of said primary substrate layer with portions of the resistor areas in electrical contact with respective conductor areas; and removing portions of said resistor areas to trim said areas to a predetermined resistive value.

5. The method of claim 1, and further comprising the step of:

printing indicia areas in reverse format on said release surface.

6. The method of claim 4, wherein said resistor areas include portions overlying respective conductor areas.

7. The method of claim 6, further comprising the step of applying defined terminal contactor areas of conductive material overlying portions of said resistor areas.

8. A method of manufacturing an electrical resistor network package comprising the sequential steps of:

providing a temporary support member having a release surface;

printing indicia areas in reverse format on said release surface;

depositing an insulating primary substrate layer over said indicia and on said release surface;

depositing defined conductor areas of conductive material to the exposed surface of said primary substrate layer;

depositing defined resistor areas of resistive material to the exposed surface of said primary substrate layer with portions of the resistor areas overlying respective conductor areas;

depositing defined terminal contactor areas of conductive material overlying portions of said resistor areas;

removing portions of said resistor areas to trim said areas to a predetermined resistive value;

joining said temporary support member to a permanent support member with the said substrate layer and its aforestated pre-applied areas in facing relationship with a supporting surface of said permanent support member; and releasing and removing said temporary support member from said primary substrate layer.

* * * * *